United States Patent
Kostylev et al.

(10) Patent No.: US 6,872,963 B2
(45) Date of Patent: Mar. 29, 2005

(54) PROGRAMMABLE RESISTANCE MEMORY ELEMENT WITH LAYERED MEMORY MATERIAL

(75) Inventors: Sergey A. Kostylev, Bloomfield Hills, MI (US); Wolodymyr Czubatyj, Warren, MI (US); Patrick Klersy, Lake Orion, MI (US)

(73) Assignee: Ovonyx, Inc., Boise, ID (US)

( * ) Notice: Subject to any disclaimer, the term of this patent is extended or adjusted under 35 U.S.C. 154(b) by 0 days.

(21) Appl. No.: 10/215,315

(22) Filed: Aug. 8, 2002

(65) Prior Publication Data

US 2004/0026730 A1 Feb. 12, 2004

(51) Int. Cl.$^7$ ............................................... H01L 47/00
(52) U.S. Cl. .................. 257/2; 257/3; 257/4; 257/5
(58) Field of Search .................. 257/2–5, 42; 438/95, 438/102

(56) References Cited

U.S. PATENT DOCUMENTS

| | | | |
|---|---|---|---|
| 6,507,061 B1 * | 1/2003 | Klersy et al. ............... 257/295 |
| 6,569,705 B2 * | 5/2003 | Chiang et al. ............... 438/95 |
| 6,586,761 B2 * | 7/2003 | Lowrey ........................ 257/3 |
| 2003/0155589 A1 * | 8/2003 | Campbell et al. ........... 257/225 |

* cited by examiner

*Primary Examiner*—Thien F Tran
(74) *Attorney, Agent, or Firm*—Philip H. Schlazer; Marvin S. Siskind (57) ABSTRACT

A programmable resistance memory element comprising alternating layers of programmable resistance material layers and stabilizing layers. The stabilizing layers may include metallic titanium or a titanium alloy. The stabilizing layers may include a telluride, such as titanium telluride.

25 Claims, 10 Drawing Sheets

PROGRAMMABLE RESISTANCE MEMORY ELEMENT WITH LAYERED MEMORY MATERIAL

FIELD OF THE INVENTION

The present invention relates generally to electrically programmable memory elements. More specifically, the present invention relates to electrically programmable memory elements using programmable resistance materials.

BACKGROUND OF THE INVENTION

Programmable resistance memory elements formed from materials that can be programmed to exhibit at least a high or low stable resistance state are known in the art. Such programmable resistance elements may be programmed to a high resistance state to store, for a example, a logic ZERO data bit. As well, they may be programmed to a low resistance state to store, for example, a logic ONE data bit.

One type of material that can be used as memory material for programmable resistance elements is phase change material. Phase change materials may be programmed between a first structural state where the material is generally more amorphous (less ordered) and a second structural state where the material is generally more crystalline (more order).

The concept of utilizing electrically programmable phase change materials for electronic memory applications is disclosed, for example, in U.S. Pat. Nos. 3,271,591 and 3,530,441, the contents of which are incorporated herein by reference. The higher energy requirements for programming the memory cells described in the '591 and '441 patents limited the use of these cells as a direct and universal replacement for present computer memory applications. The programming energy requirements of a programmable resistance memory element may be reduced in different ways. For example, the programming energies may be reduced by the appropriate selection of the composition of the memory material. An example of a phase change material having reduced energy requirements is described in U.S. Pat. No. 5,166,758, the disclosure of which is incorporated by reference herein. Other examples of memory materials are provided in U.S. Pat. Nos. 5,296,716, 5,359,712 and 6,087,674 the disclosures of which are all hereby incorporated by reference herein.

SUMMARY OF THE INVENTION

One aspect of the present invention is an electrically programmable memory element, comprising:

a memory material comprising: a first layer of a first programmable resistance material, a second layer of a second programmable resistance material, and a third material between the first and second layers, the third material comprising (a) a fourth material including at least one element selected from the group consisting of Ti, V, Cr, Zr, Nb, Mo, Hf, Ta and W, or (b) a reaction product of the fourth material and the first or second programmable resistance material; and at least one electrode in electrical communication with the memory material. The first and second programmable resistance materials may be the same material or different materials.

Another aspect of the present invention is an electrically programmable memory element, comprising:

a memory material stack comprising: a first layer of a first programmable resistance material, a second layer of a second programmable resistance material, and a third material between the first and second layers, the third material comprising (a) a metallic material, or (b) a reaction product of the metallic material and the first or second programmable resistance material; and at least one electrode in electrical communication with the memory material stack. The first and second programmable resistance materials may be the same material or different materials.

Yet another aspect of the present invention is an electrically programmable memory element, comprising:

a memory material comprising: a first layer of a first programmable resistance material, a second layer of a second programmable resistance material, and a third material between the first and second layers, the third material comprising (a) a fourth material capable of reacting with said first or second programmable resistance materials to form a compound, or (b) said compound; and at least one electrode in electrical communication with the memory material. The first and second programmable resistance materials may be the same material or different materials.

Yet another aspect of the present invention is an electrically programmable memory element, comprising: a memory material comprising alternating layers of a programmable resistance material and a second material, the second material comprising (a) a third material including at least one element selected from the group consisting of Ti, V, Cr, Zr, Nb, Me, Hf, Ta and W, or (b) a reaction product of the third material and the programmable resistance material; and at least one electrode in electrical communication with the memory material.

DETAILED DESCRIPTION OF THE INVENTION

In the following paragraphs and association with the accompanying figures, examples of memory elements formed according to embodiments of the invention are presented. Specific embodiments of the memory elements and methods of making such memory elements are described as they might be implemented for use in semiconductor memory circuits. In the interest of clarity, not all features of an actual implementation are described in this specification.

The present invention is directed to programmable resistance memory elements. The memory element includes a memory material. The memory material includes a programmable resistance material which is programmable between at least a first resistance state and a second resistance state in response to an electrical signal. The electrical signal is preferably an electrical current. The memory element further comprises one or more electrodes in electrical communication with the programmable resistance material. The one or more electrodes provide the electrical signal to the programmable resistance material.

Figure 1:
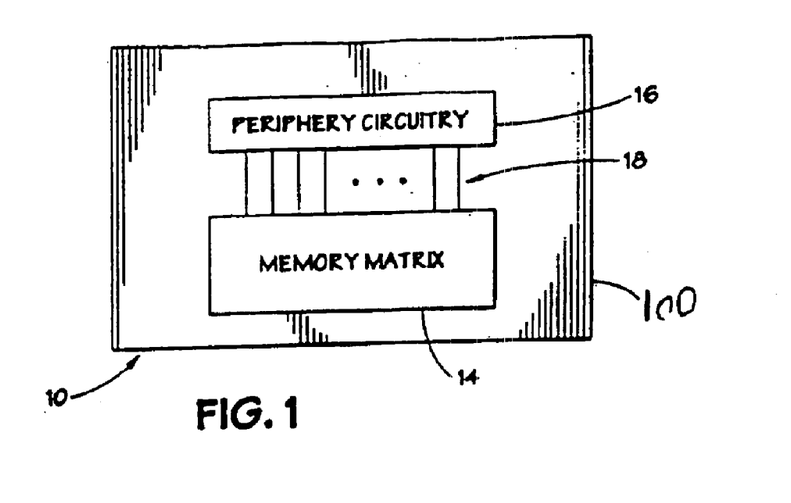
FIG. 1 shows a high-level diagram of a memory device of the present invention including a memory array and periphery circuitry formed on a substrate.

Turning now to the drawings, and referring initially to FIG. 1, a memory device is illustrated and generally designated by a reference number 10. The memory device 10 is an integrated circuit formed on a semiconductor substrate 100. The memory device 10 includes a memory matrix or array 14 that includes a plurality of memory cells for storing data. The memory matrix 14 is coupled to periphery circuitry 16 by the plurality of control lines 18. The periphery circuitry 16 may include circuitry for addressing the memory cells contained within the memory array 14, along with circuitry for storing data in and retrieving data from the memory cells. The periphery circuitry 16 may also include other circuitry used for controlling or otherwise insuring the proper functioning of the memory device 10.

Figure 2A:
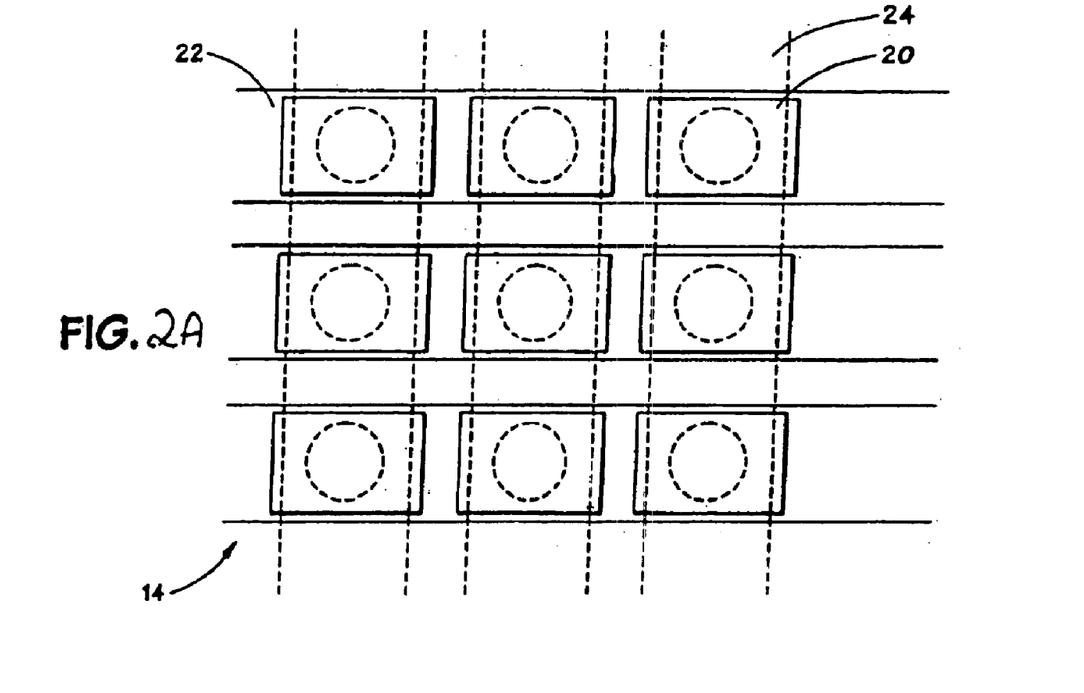
FIG. 2A shows a high-level diagram of a memory array of the present invention.

A top view of the memory array 14 is shown in FIG. 2A. As can be seen, the memory array includes a plurality of memory cells 20 that are arranged in rows and columns. The memory cells 20 in each row are coupled together by a respective wordline 22, and the memory cells 20 in each column are coupled together by a respective bitline 24.

Figure 2B:
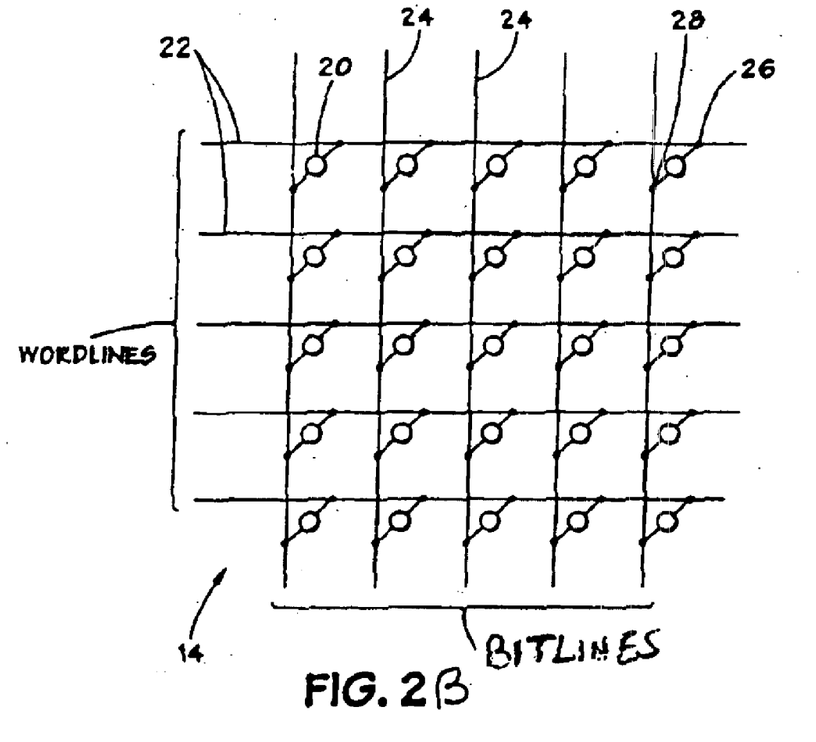
FIG. 2B is a schematic diagram of a memory array of the present invention.

A schematic diagram of the memory array 14 is shown in FIG. 2B. Each memory cell 20 includes a wordline node 26 that is coupled to a respective wordline 22, and each memory cell 20 includes a bitline node 28 that is coupled to a respective bitline 24. The conductive wordlines 22 and bitlines 24 are collectively referred to as address lines. These address lines are electrically coupled to the periphery circuitry 16 (shown in FIG. 1) so that each of the memory cells 20 can be accessed for the storage and retrieval of information.

Figure 3:
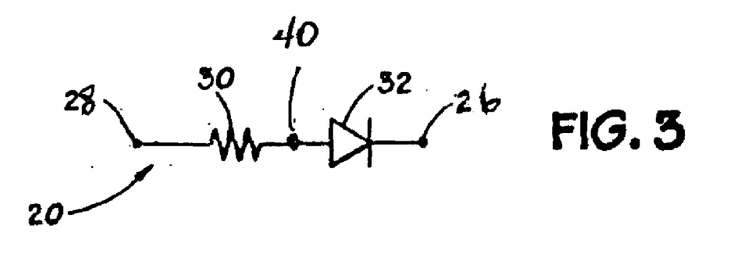
FIG. 3 is a schematic diagram of a memory cell incorporating a programmable resistance material.

FIG. 3 illustrates an exemplary memory cell 20 that may be used in the memory array 14. The memory cell 20 includes a memory element 30 which is coupled to an access device 32. The access device electrically isolates each memory element from all other memory elements in the array. In this embodiment, the memory element 30 is illustrated as a programmable resistance element and the access device 32 is illustrated as a diode. The programmable resistive element may be made of a chalcogenide material, as will be more fully explained below. As illustrated in FIG. 3, the memory element 30 is coupled to a bitline node 28 (and to bitline 24), and the access device 32 is coupled to a wordline node 26 (and to wordline 22). However, it should be understood that connections of the memory element 20 may be reversed without adversely affecting the operation of the memory array 14.

Figure 4A:
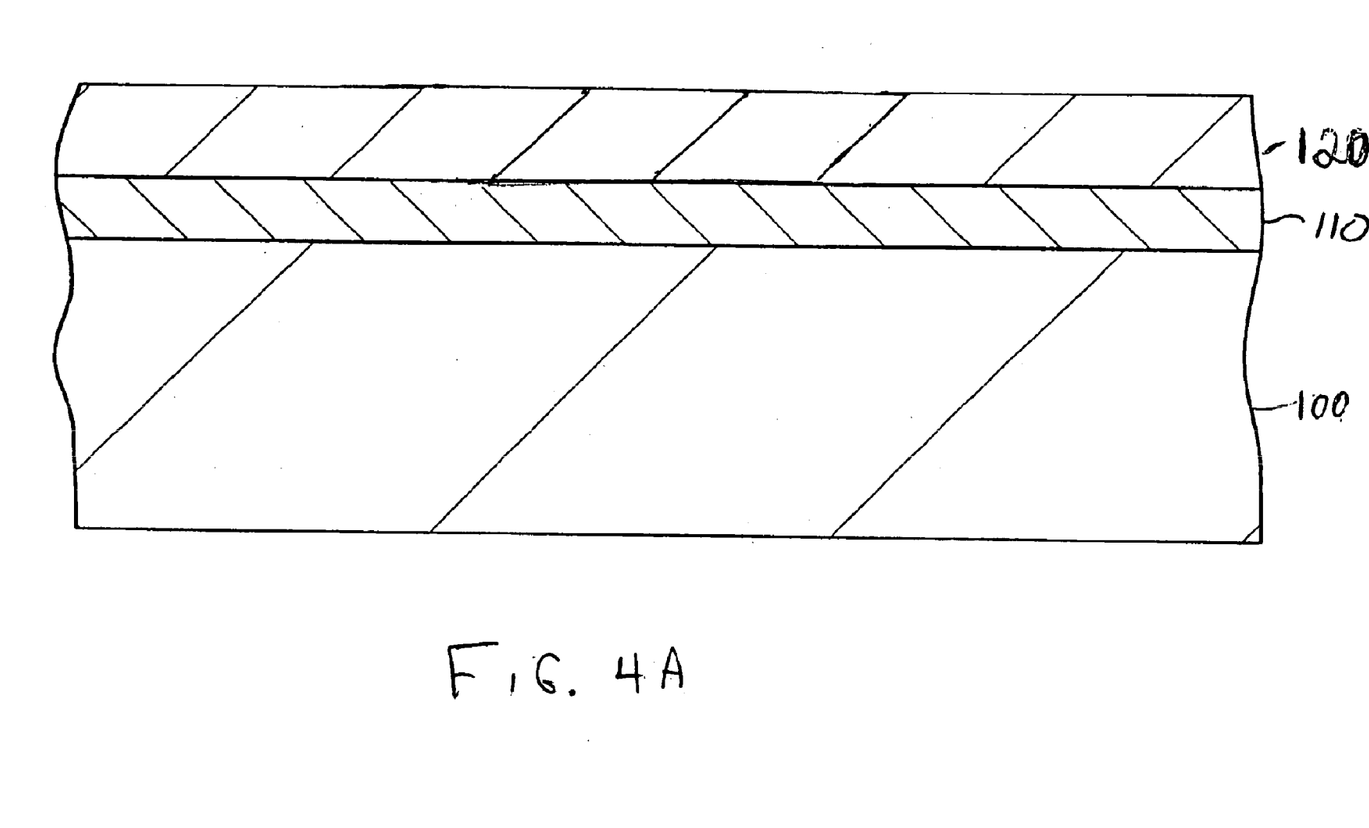
FIGS. 4A–4C show a process for making an embodiment of a programmable resistance memory element of the present invention.
Figure 4B:
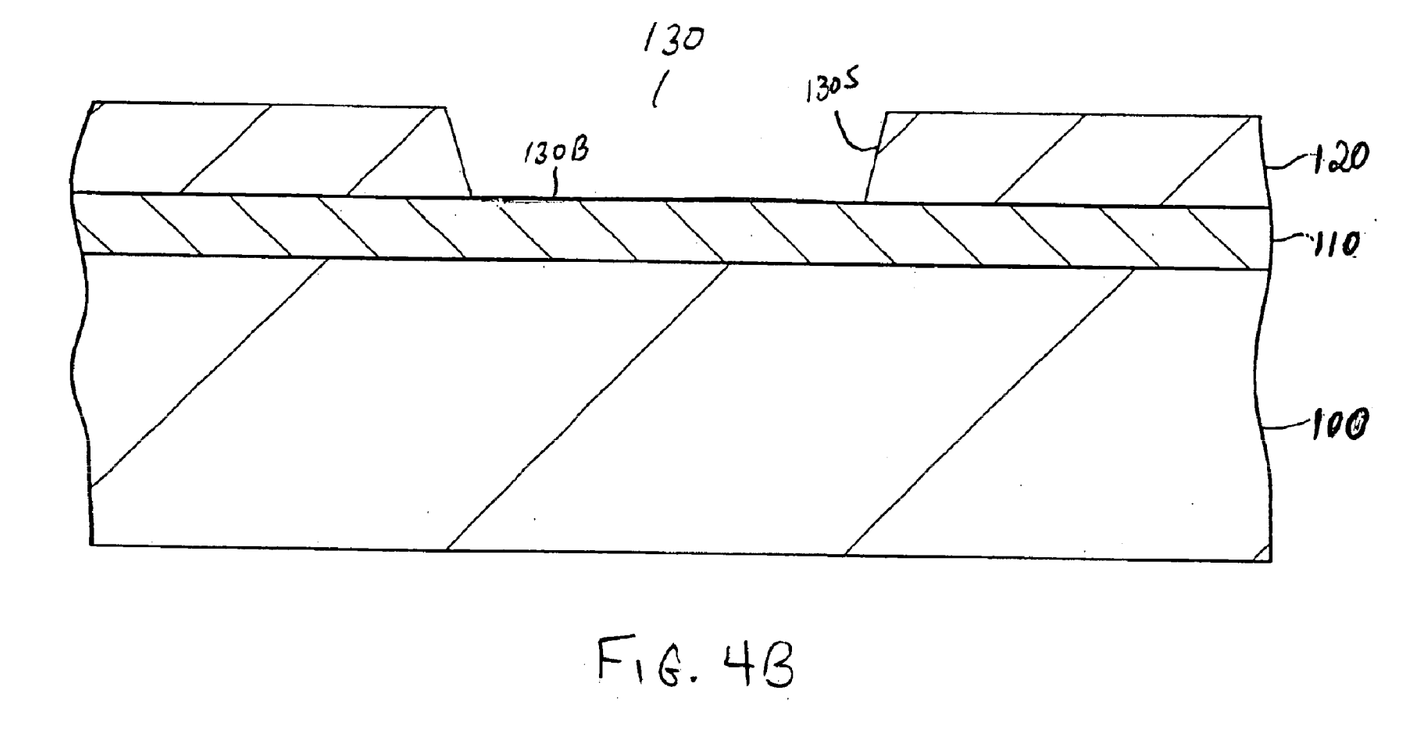
Figure 4C:
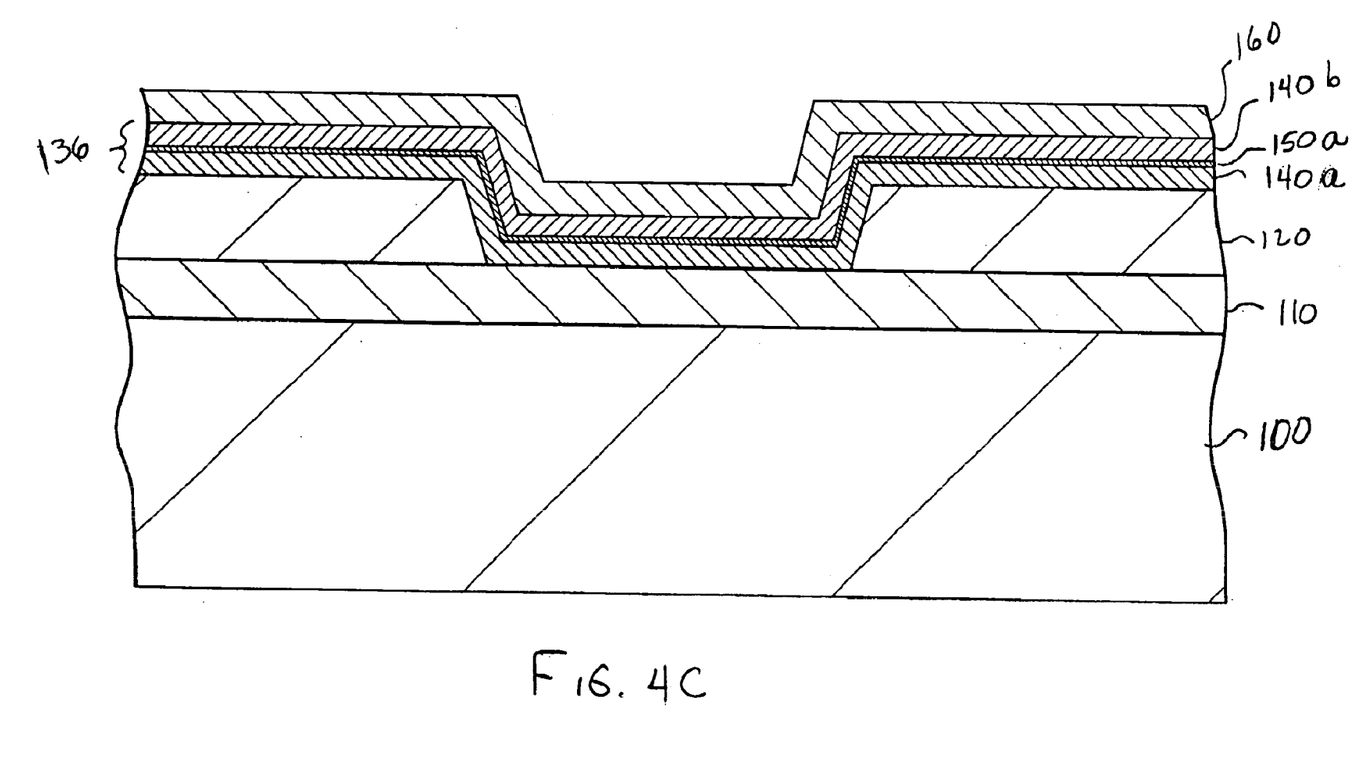

A structure of an exemplary memory cell 20 is illustrated in FIG. 4C, while a method for fabricating the memory cell 20 is described with reference to FIGS. 4A–4C. Is should be understood that while the fabrication of only a single memory cell 20 is discussed below, a plurality of similar memory cells may be fabricated simultaneously. Although not illustrated, each memory cell is electrically isolated from other memory cells in the array in any suitable manner, such as by the addition of embedded field oxide regions between each memory cell.

Referring first to FIG. 4A, a semiconductor substrate 100 is provided. The substrate 100 may include the access devices as well as the bitlines and/or wordlines. A layer 110 of a conductive material is formed on top of the substrate 100. The layer 110 of the conductive material forms a first electrode for the memory element (in this case the first electrode is a bottom electrode for the memory element). The conductive material used for layer 110 may be any conductive material. Examples of materials which may be used for layer 110 include, but are not limited to, n-type doped polysilicon, p-type doped polysilicon, p-type doped silicon carbon alloys and/or compounds, n-type doped silicon carbon alloys and/or compounds, titanium-tungsten, tungsten, tungsten silicide, molybdenum, and titanium nitride. Other examples include titanium carbon-nitride, titanium aluminum-nitride, titanium silicon-nitride, and carbon.

A dielectric material 120 is formed on top of the conductive layer 110. The dielectric layer 120 may be comprised of any suitable dielectric material, such as silicon nitride or silicon dioxide. The dielectric layer 120 may be formed in any suitable manner, such as by chemical vapor deposition (CVD).

Referring to FIG. 4B, an opening 130 (also referred as a "window") is formed through the dielectric layer 120 to expose a portion of the underlying conductive layer 110. Generally, the opening 130 may be any shape. For example, the opening 130 may be formed as a hole (such as a substantially circular or rectangular hole). Alternately, the opening 130 may be formed as a trench. The opening 130 includes the sidewall surface 130S about the periphery of the opening and the bottom surface 130B. The opening 130 is preferably a substantially circular hole.

Any suitable method of forming the opening 130 may be used. For example, using standard photolithographic techniques, a hard mask (not shown) may be deposited on top of the dielectric layer 120 and patterned in the size and shape of the resulting opening 130. Hence, in one embodiment, the opening may be sized at the photolithographic limit. Alternately, in another embodiment, it is possible that the opening 130 be formed so that one or more of its lateral dimensions are less than the photolithographic dimension. In yet another embodiment, it is possible that top of the opening 130 may be sized at the photolithographic limit while the bottom of the opening has one or more lateral dimensions which are sized at or below the photolithographic limit.

A memory material is then deposited into the opening 130. The memory material includes alternating layers of (1) programmable resistance material layers and (2) "stabilizing" layers. The alternating layers of programmable resistance material layers and stabilizing layers is referred to herein as a "memory material stack". The memory material stack includes at least three layers but may have either an odd number of total layers (for example, 3, 5, 7 etc.) or an even number of total layers (for example 4, 6, 8 etc).

Various arrangements of the alternating layers are possible: 1) the memory material stack may begin with and end with programmable resistance material layers; 2) the memory material stack may begin with and end with stabilizing layers; 3) the memory material stack may begin with a programmable resistance material layer and end with a stabilizing layer; or 4) the memory material stack may begin with a stabilizing layer and end with a programmable resistance material layer. Preferably, the memory material stack includes at least two programmable resistance material layers.

In the embodiment of the invention shown in FIG. 4C, the memory material stack 136 begins and ends with a programmable resistance material layer. The memory material stack 136 includes programmable resistance material layers 140a,b and stabilizing layer 150a. A first programmable resistance material layer 140a is deposited into the opening 130 shown in FIG. 4B. In the example shown, the first programmable resistance material layer 140a is deposited onto the conductive layer 110 (the bottom electrode) as well as onto the sidewall and top surfaces of the dielectric layer 120. A stabilizing layer 150a is then deposited onto the first programmable resistance memory layer 140a. A second programmable resistance memory layer 140b is then deposited onto the stabilizing layer 150a. Hence, the stabilizing layer 150a is disposed between a first and a second layer of programmable resistance material. The first and second programmable resistance layers 140a,b may be formed of the same programmable resistance material or different programmable resistance materials. A conductive layer 160 is then formed on the second programmable resistance material layer 140b. The conductive layer 160 serves as the second electrode (in this case the top electrode) for the memory element. The conductive layer 160 may be formed of the same materials as the conductive layer 110. In the embodiment shown in FIG. 4C the first programmable resistance layer 140a is adjacent to the bottom electrode while the second programmable resistance layer 140b is adjacent to the top electrode. The bottom electrode 110 and the top electrode 160 are in electrical communication with the memory material stack 136.

Figure 5:
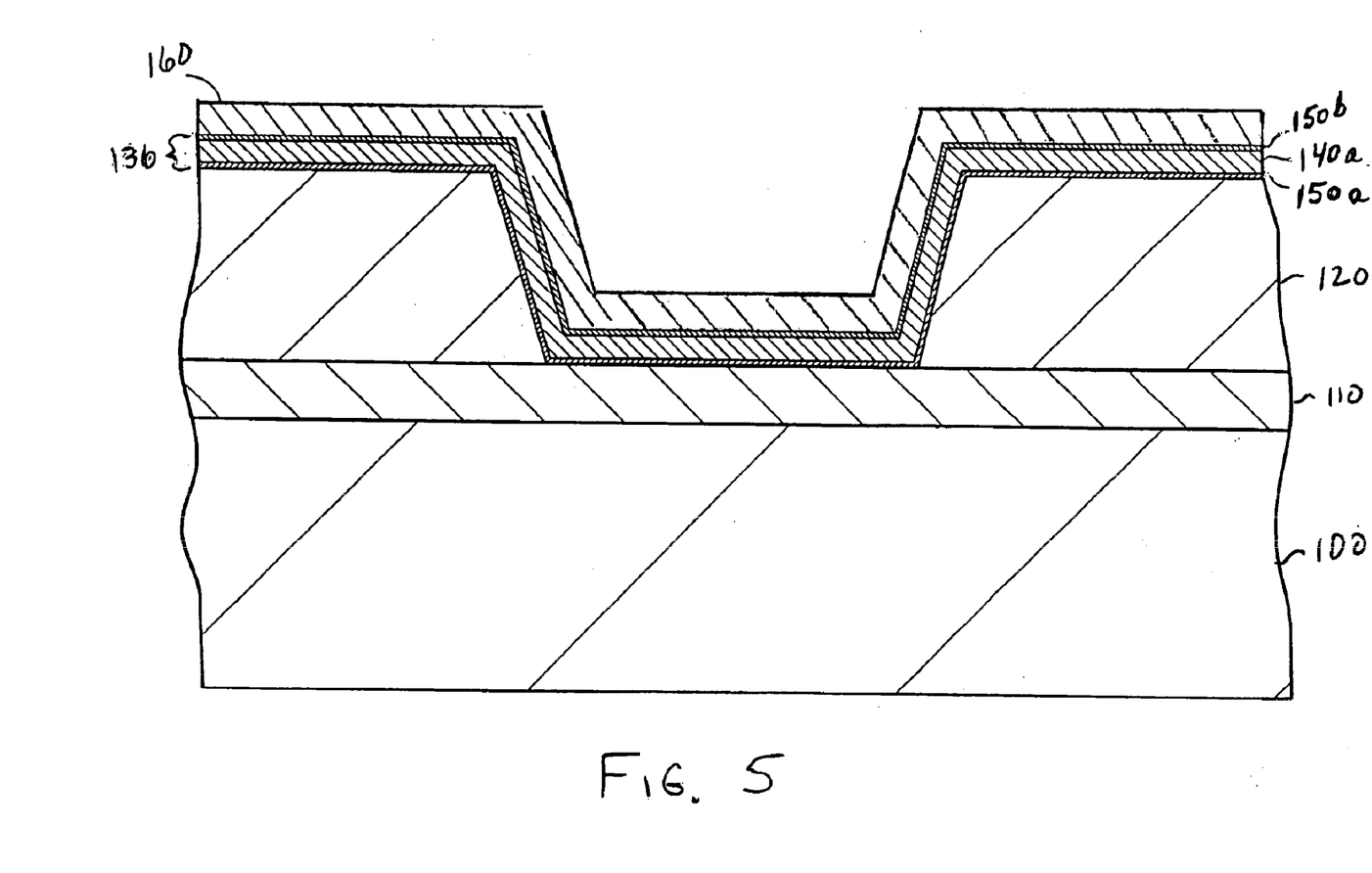
FIG. 5 shows an alternate embodiment of the present invention where the memory material stack begins and ends with a stabilizing layer.

The embodiment of the invention shown in FIG. 5 is an embodiment where the memory material stack 136 begins and ends with a stabilizing layer. In this embodiment, the memory material stack 136 includes programmable resistance material layer 140a and stabilizing layers 150a,b. A first stabilizing layer 150a is deposited into the opening 130 (shown in FIG. 4B). In the example shown, the first stabilizing layer 150a is deposited onto the conductive layer 110 as well as onto the sidewall surface and top surface of the dielectric layer 120. A programmable resistance material layer 140a is deposited onto the first stabilizing layer 150a. A second stabilizing layer 150b is deposited onto the programmable resistance layer 140a. A conductive layer 160 is then deposited onto the second stabilizing layer 150b. Hence, in this embodiment, the stabilizing layer 150a is adjacent to the bottom electrode 110 while the stabilizing layer 150b is adjacent to the top electrode 160. The first and second stabilizing layers 150a,b may be formed of the same material or they may be formed of different materials.

Figure 6:
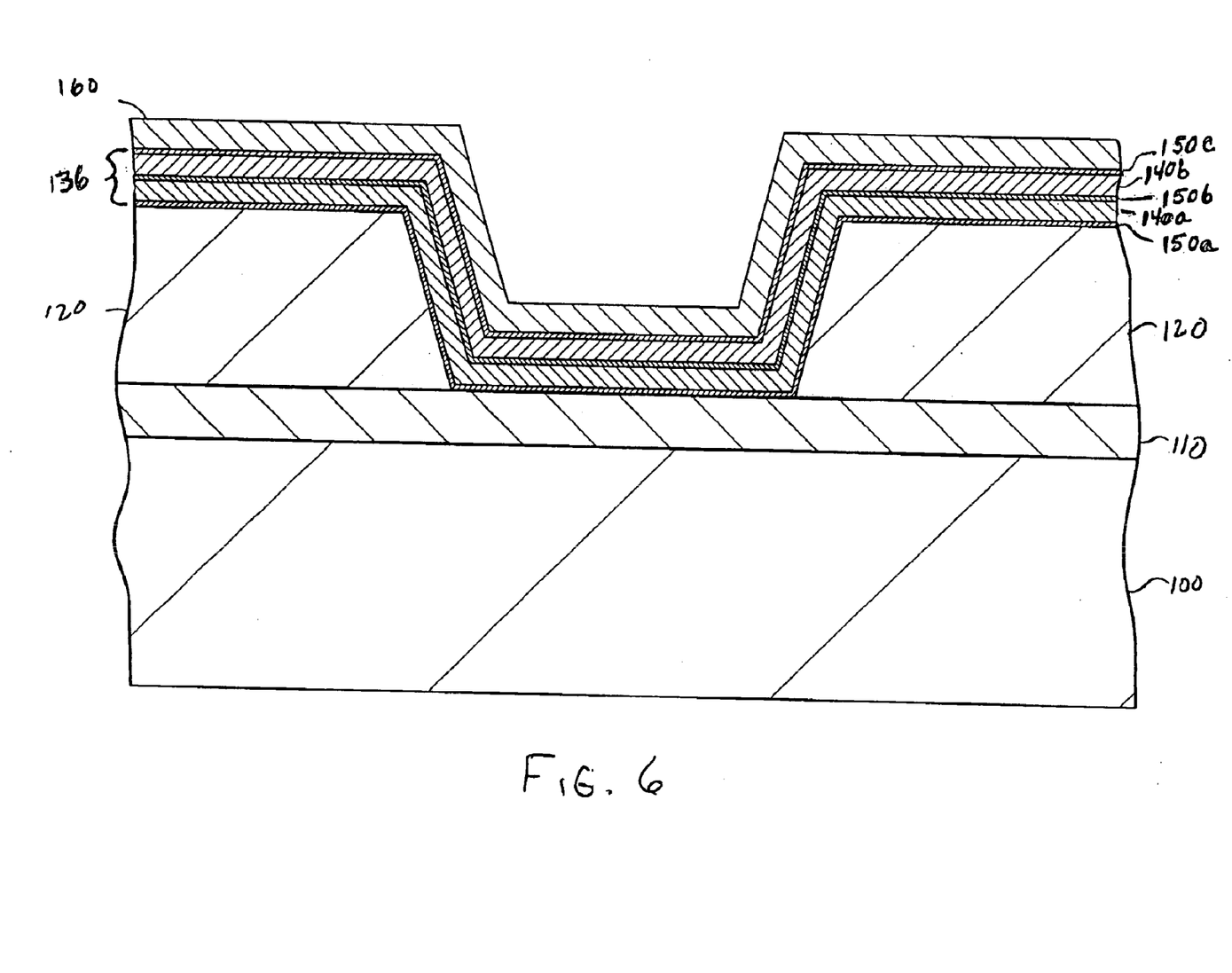
FIG. 6 shows an alternate embodiment of the present invention where the memory material stack begins and ends with a stabilizing layer.

The embodiment of the invention shown in FIG. 6 is another embodiment of the invention where the memory material stack 136 begins and ends with a stabilizing layer. In this embodiment, the memory material stack includes two programmable resistance material layers 140a,b and three stabilizing 150a,b,c. As shown, the stabilizing layer 150b is between the programmable resistance material layers 140a and 140b. The stabilizing layer 150a is adjacent to the bottom electrode 110 while the stabilizing layer 150c is adjacent to the top electrode 160.

Figure 7:
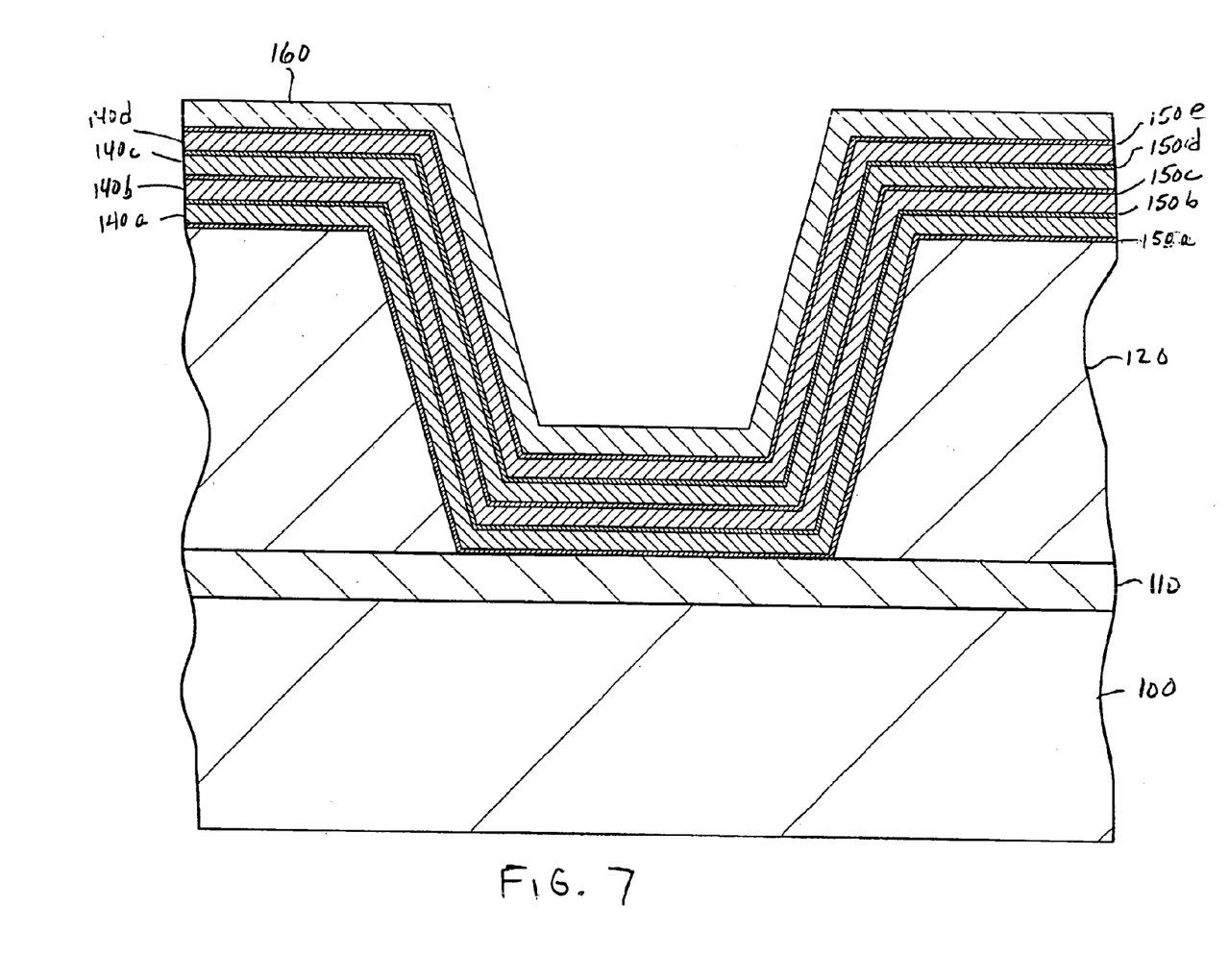
FIG. 7 shows an alternate embodiment of the present invention where the memory material stack begins and ends with a stabilizing layer.

The embodiment shown in FIG. 6 shows two programmable resistance material layers. There may be more than two programmable resistance material layers. The embodiment of the invention shown in FIG. 7 is another example where the memory material stack begins and ends with a stabilizing layer. The memory material stack shown in FIG. 7 begins with stabilizing layer 150a and ends with stabilizing layer 150e. In this embodiment, the memory material stack includes four programmable resistance material layers 140a,b,c,d and five stabilizing layers 150a,b,c,d,e.

Figure 8:
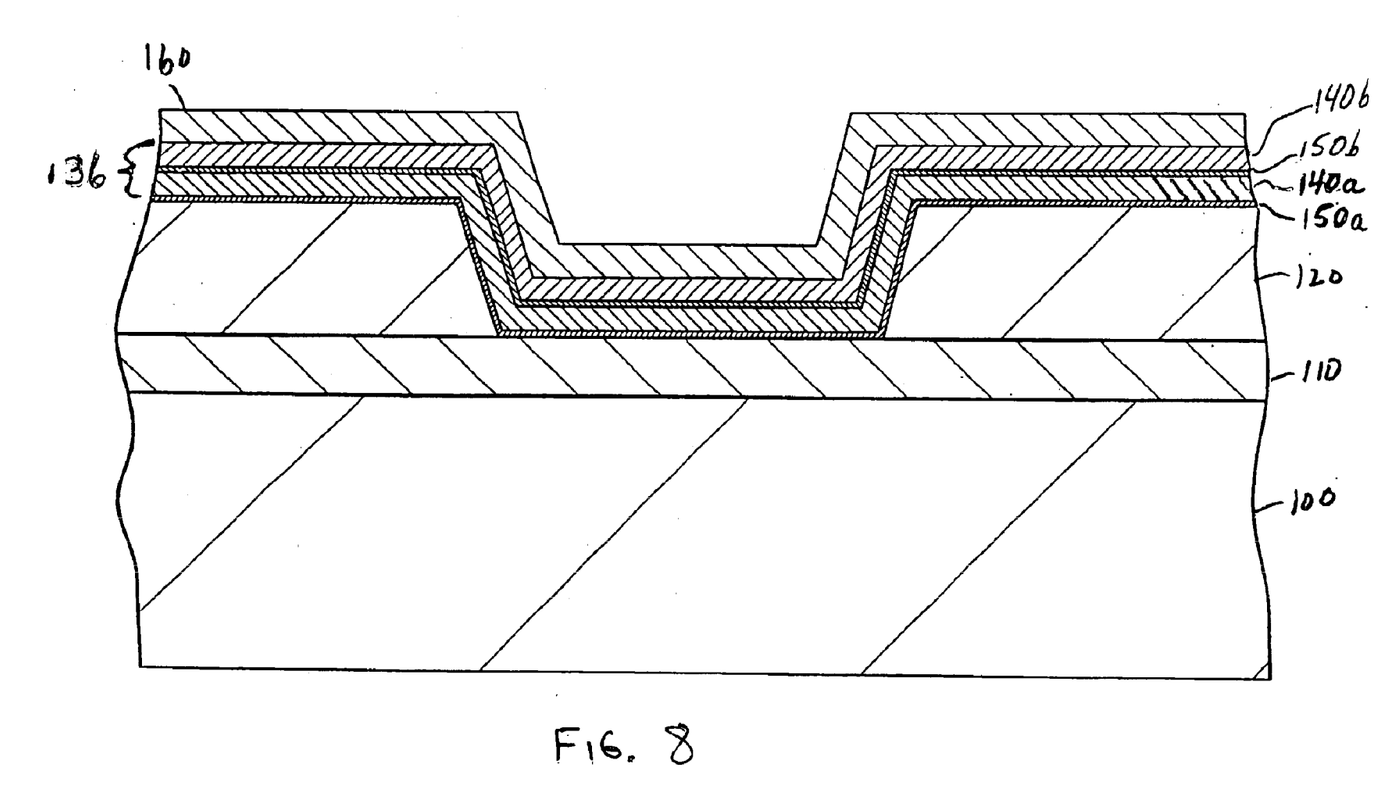
FIG. 8 shows an alternate embodiment of the present invention where the memory material stack begins with a stabilizing layer and ends with a programmable resistance material layer.

Alternately, the memory material stack may begin with a stabilizing layer and end with a programmable resistance material layer. This is shown in FIG. 8 where the memory material stack begins with stabilizing layer 150a (shown adjacent to the bottom electrode 110) and ends with programmable resistance material layer 140b (shown adjacent to the top electrode 160). In the embodiment shown in FIG. 8, the memory material stack 136 includes programmable resistance material layers 140a,b and stabilizing layers 150a, b.

Figure 9:
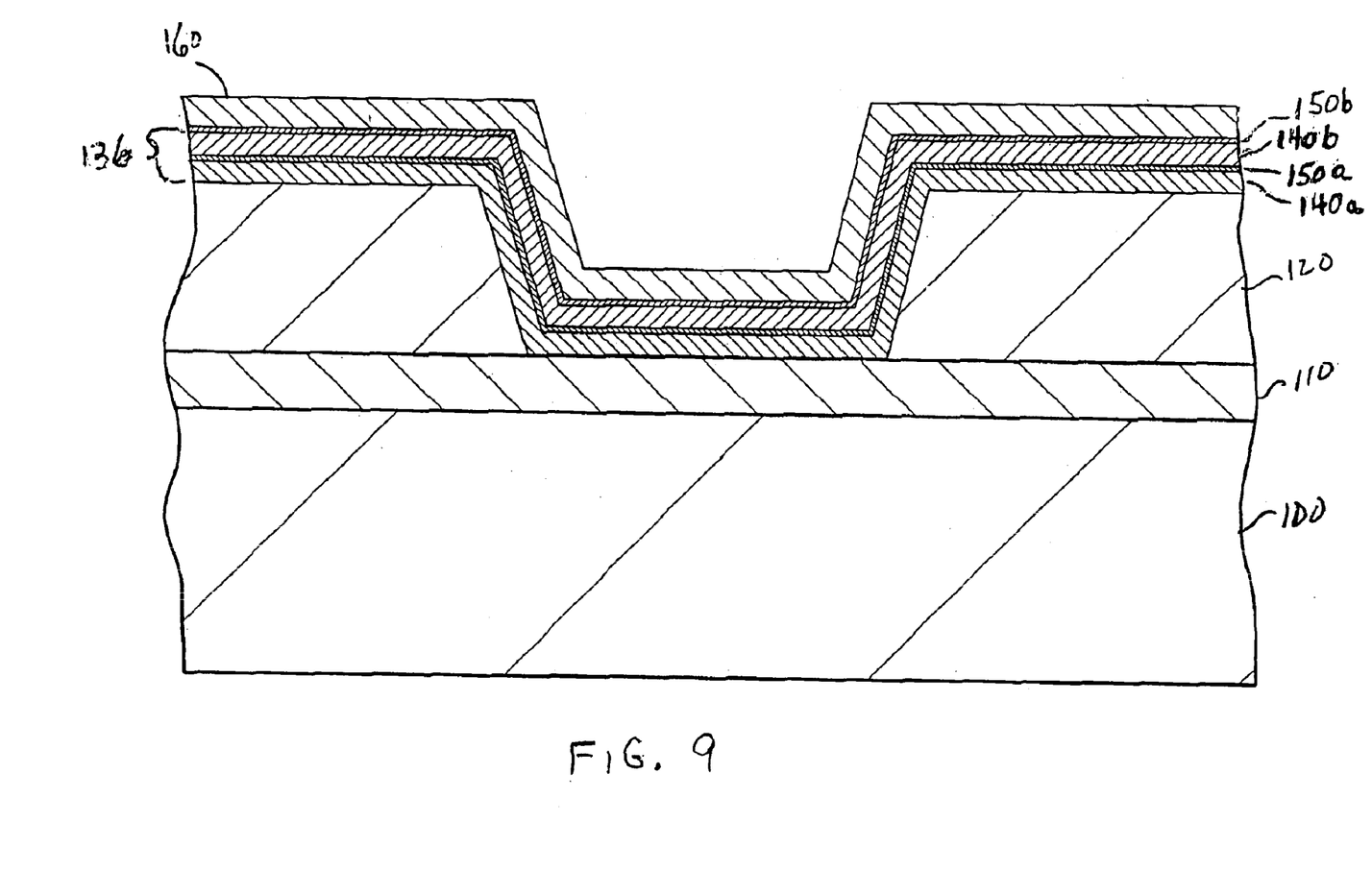
FIG. 9 shows an alternate embodiment of the present invention where the memory material stack beings with a programmable resistance material layer and ends with a stabilizing layer.

Alternately, the memory material stack may begin with a programmable resistance material layer and end with a stabilizing layer. This is shown in FIG. 9 where the memory material stack 136 begins with programmable resistance material layer 140a and ends with stabilizing layer 150b. In the embodiment shown in FIG. 9, the memory material stack 136 includes programmable resistance material layers 140a,b and stabilizing layers 150a,b.

Preferably, the memory material stack includes at least two layers of programmable resistance material and a stabilizing layer that is between the two layers of programmable resistance material. That is, the memory material stack preferably includes at least a first programmable resistance material layer, a second programmable resistance material layer and a stabilizing layer between the first and the second programmable resistance material layer. Each of the programmable resistance material layers may be formed of the same programmable resistance material. Alternately, two or more of the programmable resistance material layers may be formed of different programmable resistance materials. In embodiments of the invention that include two or more stabilizing layers, all of the stabilizing layers may be formed of the same material. Alternately, two or more of the stabilizing layers may be formed of different materials.

In one embodiment of the invention one or more of the stabilizing layers are metallic layers that consist essentially of a metallic material. The metallic material may be a substantially pure metal. Alternately, the metallic material may be a metal alloy. The metal alloy preferably includes two or more metallic elements; however, it is possible that the alloy includes one or more nonmetallic elements (such as the element carbon). The metal alloy may include intermetallic compounds. It is also possible that the metallic material may be a mixture or composite of a substantially pure metal and a metal alloy.

Preferably, one or more of the stabilizing layers are formed from a metallic material that includes one or more elements selected from the group consisting of Ti, V, Cr, Zr, Nb, Mo, Hf, Ta, and W. More preferably, one or more of the stabilizing layers are formed from a metallic material that includes one or more of the elements selected from the group consisting of Ti, V, and Cr. Most preferably, one or more of the stabilizing layers are formed from a metallic material that includes one or more of the elements selected from the group consisting of Ti. In one embodiment of the invention, one or more of the stabilizing layers is a metallic material that consist essentially of the element Ti.

Preferably, one or more of the stabilizing layers includes at least one material selected from the group consisting of metallic titanium, metallic vanadium, metallic chromium, metallic zirconium, metallic niobium, metallic molybdenum, metallic hafnium, metallic tantalum, metallic tungsten, titanium alloy, vanadium, chromium alloy, zirconium alloy, niobium alloy, molybdenum alloy, hafnium alloy, tantalum alloy, and tungsten alloy. More preferably, one or more of the stabilizing layers includes at least one material selected from the group consisting of metallic titanium, metallic vanadium, metallic chromium, titanium alloy, vanadium alloy, and chromium alloy. Most preferably, one or more of the stabilizing layers includes a material selected from the group consisting of metallic titanium and titanium alloy. In one embodiment of the invention, one or more of the stabilizing layers consists essentially of metallic titanium and/or titanium alloy. In another embodiment of the invention, one or more of the stabilizing layers consist essentially of metallic titanium.

In an alternate embodiment of the invention one or more of the stabilizing layers may be formed from any material that includes one or more elements from the group consisting of Ti, V, Cr, Zr, Nb, Mo, Hf, Ta, and W. Preferably, one or more of the stabilizing layers may be formed from a material that includes one or more elements from the group consisting of Ti, V and Cr. Most preferably, one or more of the stabilizing layers may be formed from a material that includes the element Ti. In this alternate embodiment the stabilizing layers may be non-metallic as well as metallic. As noted above, metallic stabilizing layers may be in the form of a substantially pure metal (such as substantially pure titanium) or a metallic alloy (such as a titanium alloy). The stabilizing layer may be in the form of a non-metallic material. The stabilizing layer may include one or more materials selected from the group consisting of oxides, sulfides, nitride, fluorides, sulfides, chlorides, carbides, oxynitrides, carboxynitrides, borides, and phosphides. The stabilizing layer may include an oxide such as titanium oxide or a sulfide as titanium sulfide.

In yet another embodiment of the invention, the stabilizing layers may include any material that is capable of reacting with and forming a reaction product with the programmable resistance material. The reaction product formed may be a compound. Preferably, the reaction product formed is a telluride. All or a portion of the stabilizing layer may be formed of the reaction product. As noted below, the programmable resistance material may be a phase change material that is formed from a plurality of atomic elements. Preferably, the programmable resistance material includes at least one chalcogen element. The chalcogen element may be chosen from the group consisting of Te and Se. An example of a programmable resistance material includes the elements Te, Ge and Sb. Hence, in one embodiment of the invention, it is preferable that the stabilizing layer reacts with the element Te to form a telluride. Examples of elements that can form a telluride with the element Te include the element Ti (reacting with Te to form titanium telluride) and the element Pb (reacting with Te to form the element lead telluride). It is possible that stabilizing layer materials be chosen to react with other elements of the programmable resistance material.

The stabilizing layers may all be formed from the same material. Alternately, two or more of the stabilizing layers may be formed from different materials.

One or more of the stabilizing layers of the memory material stack have a thickness which is preferably less about 50 Angstroms, more preferably less than about 25 Angstroms and, most preferably, less than about 20 Angstroms. One or more of the stabilizing layers may have a thickness that is less than about 15 Angstroms. In one embodiment of the invention, the thickness of one or more of the stabilizing layers may be about 10 Angstroms. Each of the stabilizing layers may have substantially the same thickness. Alternately, two or more of the stabilizing layers may have different thicknesses.

The programmable resistance material is preferably a phase change material. The phase change materials may be any phase change memory material known in the art. Preferably, the phase change materials are capable of exhibiting a first order phase transition. Examples of materials are described in U.S. Pat. Nos. 5,166,758, 5,296,716, 5,414,271, 5,359,205, 5,341,328, 5,536,947, 5,534,712, 5,687,112, and 5,825,046 the disclosures of which are all incorporated by reference herein.

The phase change materials may be formed from a plurality of atomic elements. Preferably, the memory material includes at least one chalcogen element. The chalcogen element may be chosen from the group consisting of Te and Se. (Also, the phase change material may include mixtures and alloys of Te and Se). The phase change material may further include at least one element selected from the group consisting of Ge, Sb, Bi, Pb, Sn, As, S, Si, P, and O. In one embodiment, the phase change material comprises the elements Te, Ge and Sb. In another embodiment, the phase change material consists essentially of the elements Te, Ge and Sb. An example of a phase change material which may be used is $Te_2Ge_2Sb_5$.

The phase change material may include at least one transition metal element. The term "transition metal element" as used herein include the elements 21 to 30, 39 to 48, 57 and 72 to 80 from the periodic table. Preferably, the one or more transition metal elements are selected from the group consisting of Cr, Fe, Ni, Nb, Pd, and Pt. The phase change materials which include transition metal elements may be elementally modified forms of the phase change materials in the Te—Ge—Sb ternary system. This elemental modification may be achieved by the incorporation of transition metals into the basic Te—Ge—Sb ternary system, with or without an additional chalcogen element, such as Se.

An example of an elementally modified programmable resistance material is a phase change memory material which includes Te, Ge, Sb and a transition metal, in the ratio $(Te_aGe_bSb_{100-(a+b)})_cTM_{100-c}$ where the subscripts are in atomic percentages which total 100% of the constituent elements, wherin TM is one or more transition metals, a and b are as set forth herein above for the basic Te—Ge—Sb ternary system and c is between about 90% and about 99.99%. Another example of an elementally modified programmable resistance material is phase change memory material which includes Te, Ge, Sb, Se and a transition metal, in the ratio $(Te_aGe_bSb_{100-(a+b)})_cTM_dSe_{100-(c+d)}$ where the subscripts are in atomic percentages which total 100% of the constituent elements, TM is one or more transition metals, a and b are as set forth hereinabove for the basic Te—Ge—Sb ternary system, c is between about 90% and 99.5% and d is between about 0.01% and 10%.

Each of the programmable resistance material layers has a thickness which is preferably less than about 300 Angstroms, more preferably less than about 225 Angstroms, and most preferably less than about 175 Angstroms. In one embodiment of the invention the thickness of the programmable resistance layers is preferably between about 175 Angstroms and 125 Angstroms, and more preferably about 150 Angstroms.

It is noted that the total thickness of the programmable resistance material (that is, the sum of the thicknesses of the individual programmable resistance layers) and, hence, the number of programmable resistance layers used in the memory material stack may be related to the desired threshold voltage of the memory element. The total thickness is preferably less than about 800 Angstroms, more preferably between about 500 and 700 Angstroms, and most preferably between about 550 and 650 Angstroms. In one embodiment, the total thickness of the programmable resistance material may be about 600 Angstroms. A specific example of a memory material stack of the present invention includes four programmable resistance material layers where the thickness of each of the layers is about 150 Angstroms.

The alternating layers of programmable resistance layers and stabilizing layers preferably creates a composite material structure that may improve the structural integrity of the memory device. The composite material structure provides a way to replace a relatively thick layer of programmable resistance material (for example, a layer having a thickness of about 600 Angstroms) with a plurality of much thinner and more flexible layers of programmable resistance material (for example, layers having thicknesses of about 150 Angstroms). The use of relatively thin layers of programmable resistance material (separated by the stabilizing layers) may therefore increase the overall flexibility of the programmable resistance material and allow the programmable resistance material as well as the entire memory element and memory cell to better withstand applied stresses and strains.

The stabilizing layers also may promote adhesion between the layers of programmable resistance material (as well as between layers of the programmable resistance material and the electrodes of the memory element). As noted above, certain atomic elements (and, preferably, certain metallic elements) have an affinity for Te and readily combine with Te to form compounds called tellurides. For example, the element Ti has an affinity for Te and combines with the Te that exists in the programmable resistance material to form the compound $TiTe_2$. Because of its affinity of Te, a stabilizing layer that includes the element Ti (for example, as metallic titanium or as titanium alloy) may promote adhesion between two programmable resistance material layers that are on opposite sides of the stabilizing layer. It is also possible that a stabilizing layer may even promote adhesion between a programmable resistance material layer and a conductive layer (for example, a conductive layer that may be serving as an electrode) that are on opposite sides of the stabilizing layer (such as conductive layer 110 and programmable resistance material layer 140*a* that are on opposite sides of stabilizing layer 150*a* shown in FIG. 6).

During the programming of the memory element, electrical currents are introduced into the programmable resistance material. These electrical currents (as well as other forces such as electric fields and thermal gradients) may cause one or more of the constituents of the programmable resistance material to migrate. For example, electrical current may cause the electromigration of Te and create regions of excess Te that are inactive in the programming process (i.e., the ratios of constituents are no longer appropriate). In addition to promoting adhesion between the programmable resistance material layers, the Ti may also prevent the formation of regions within the programmable resistance memory layers where there is an excess amount of Te. Since Ti has an affinity for Te and reacts with the Te to form the telluride compound $TiTe_2$, it may help to remove the excess Te from the programmable resistance material layers.

It is noted that the reaction of Ti with Te to form the telluride $TiTe_2$ may consume at least a portion of the "as deposited" stabilizing layer. The consumed portion of the stabilizing layer may thus be replaced with the compound $TiTe_2$. Hence, it is possible that all or a portion of material that is initially deposited to form the stabilizing layers may be converted into one or more regions (or layers) of titanium telluride (or another telluride depending upon the composition of the stabilizing layer). More generally, it is possible that components from the programmable resistance material layers react with components of the materials that are initially deposited as the stabilizing layers and that these reactions form reaction products. All or a portion of the stabilizing layers may thus be formed of these reaction products. Hence, it is possible that all or a portion of the materials initially deposited to form the stabilizing layers (the "as deposited stabilizing layer materials") react with the programmable resistance material to form reaction products that replace the as deposited stabilizing layer materials. The reaction products may be compounds such as tellurides. Likewise, it is also possible that there is diffusion between the as deposited stabilizing layer materials and the programmable resistance layer materials. New materials may be formed as a result of this diffusion and these new materials may also be part of the stabilizing layers.

In addition to the programmable resistance material layers and stabilizing layers which are arranged in a memory material stack, the memory element of the present invention further includes one or more electrodes which are in electrical communication with the memory material stack and which deliver an electrical signal to the memory material stack. Generally, the one or more electrodes may take any form. In one embodiment of the invention, the memory device includes two spacedly disposed electrodes. Preferably, each of the spacedly disposed electrodes are positioned adjacent to the memory material stack. More preferably, the two electrode are positioned so that the memory material stack is between the two electrodes. Each of the electrodes may be formed of one or more conductive layers. In the embodiments of the invention shown in FIGS. 4C through 9, each of the electrodes is a conductive layer positioned adjacent to the memory material stack. Alternate embodiments are possible where one or both of the electrodes are formed of multiple conductive layers. Examples of alternate electrode structures are described in U.S. Pat. Nos. 5,166,758, 5,296,716, 5,359,205, 5,406,509, 5,534,711 and 5,536,947 the discloses of which are all incorporated by reference herein. In another embodiment of the invention at least one of the electrodes may take the form of a tapered electrode structure that tapers to a peak adjacent to the memory material. An example of this type of structure is shown in U.S. Pat. No. 5,687,112 and U.S. Pat. No. RE37,259, the disclosures of which are both incorporated by reference herein. In yet another embodiment, at least one of the electrodes (preferably, the bottom electrode) may be in the form of a conductive sidewall layer. For example, the bottom electrode may be a conductive liner or a conductive spacer. Examples of this type of electrode structure are shown in U.S. patent application Ser. Nos. 09/276,273, 09/620,318, 09/677,957 and 09/891,157, the disclosures of which are all herby incorporated by reference herein. In yet another embodiment, the memory element may include an electrode in the form of a field emitter that is positioned in close proximity to the memory material stack (in this case a second electrode may or may not be used). The emitter tip serves as a source of electrons. Generally, the memory material stack of the present invention is applicable to all memory element structures.

The memory elements of the present invention may be electrically coupled to isolation/selection devices and to addressing lines in order to form a memory array. The isolation/addressing devices permit each discrete memory element to be read and written to without interfering with information stored in adjacent or remote memory element of the array. Generally, the present invention is not limited to the use of any specific type of isolation/addressing device. Examples of isolation/addressing devices include field-effect transistors, bipolar junction transistors, and diodes. Examples of field-effect transistors include JFET and MOSFET. Examples of MOSFET include NMOS transistors and PMOS transistors. Furthermore NMOS and PMOS may even be formed on the same chip for CMOS technologies.

Hence, associated with each memory element of a memory array structure is isolation/addressing device for that memory element thereby enabling that cell to be read and written without interfering with information stored in other adjacent or remote memory elements of the array.

The programmable resistance material may be programmed to at least first resistance state and a second resistance state. The first resistance state has a first resistance value while the second resistance state has a second resistance value different from the first resistance value. The programmable resistance material is preferably programmed by electrical signals (such as currents). In one embodiment, the programmable resistance material is programmable to two resistance states so that each of the memory elements is capable of storing a single bit of information. In another embodiment, the programmable resistance material is programmable to at least three resistance states so that each of the memory elements is capable of storing more than one bit of information. In yet another embodiment, the programmable resistance material is programmable to at least four resistance states so that each of the memory elements is capable of storing at least two bits of information. Hence, the programmable resistance material may have a range of resistance values which is sufficient to provide for the storage of more than two bits of information.

The programmable resistance materials may be directly overwritable so that they can be programmed from any one of their resistance states to any other of their resistance states without first having to be set to a starting state. Preferably, the same programming pulse or pulses may be used to program the programmable resistance material to a specific resistance state regardless of its previous resistance state. (For example, the same current pulse or pulses may be used to program the material to its high resistance state regardless of its previous state). An example of a method of programming the memory element is provided in U.S. Pat. No. 6,075,719, the disclosure of which is incorporated by reference herein.

It is to be understood that the disclosure set forth herein is presented in the form of detailed embodiments described for the purpose of making a full and complete disclosure of the present invention, and that such details are not to be interpreted as limiting the true scope of this invention as set forth and defined in the appended claims.

We claim:

1. An electrically programmable memory element, comprising:
    a memory material comprising:
        a first layer of a first programmable resistance material,
        a second layer of a second programmable resistance material, and
        a third material between said first and second layers, said third material consisting essentially of (a) a metallic material and/or (b) a reaction product of said metallic material and said first or second programmable resistance material, said third material in direct contact with said first layer and said second layer, said metallic material comprising a substantially pure metal and/or a metal alloy; and
    at least one electrode in electrical communication with said memory material.

2. The memory element of claim 1, wherein said metallic material includes at least one element selected from the group consisting of Ti, V, Cr, Zr, Nb, Mo, Hf, Ta and W.

3. The memory element of claim 1, wherein said metallic material includes at least one of element selected from the group consisting of Ti, V and Cr.

4. The memory element of claim 1, wherein said metallic material includes the element Ti.

5. The memory element of claim 1, wherein said metallic material consists essentially of the element Ti.

6. The memory element of claim 1, wherein said metallic material consists essentially of metallic titanium and/or a titanium alloy.

7. The memory element of claim 1, wherein said metallic material consists essentially of metallic titanium.

8. The memory element of claim 1, wherein said first and second layers have a thickness less than 300 Angstroms.

9. The memory element of claim 1, wherein said third material has a thickness less than 50 angstroms.

10. The memory element of claim 1, wherein said first and second programmable resistance materials consist essentially of a phase change material.

11. The memory element of claim 1, wherein said first and second programmable resistance materials include a chalcogen element.

12. The memory element of claim 1, wherein said first programmable resistance material is the same as said second programmable resistance material.

13. The memory material of claim 1, wherein said reaction product includes a telluride.

14. The memory element of claim 1, wherein said at least one electrode includes a first and a second electrode.

15. An electrically programmable memory element, comprising:
    a memory material comprising:
        a first layer of a first programmable resistance material,
        a second layer of a second programmable resistance material, and
        a third material between said first and second layers, said third material consisting essentially of (a) a fourth material capable of reacting with said first or second programmable resistance material to form a compound and/or (b) said compound, said third material in direct contact with said first layer and said second layer, said fourth material comprising at least one element selected from the group consisting of Ti, V, Cr, Zr, Nb, Mo, Hf, Ta and W, and
    at least one electrode in electrical communication with said memory material.

16. The memory element of claim 15, wherein said compound is a telluride.

17. The memory element of claim 15, wherein said fourth material includes at least one element selected from the group consisting of Ti, V and Cr.

18. The memory element of claim 15, wherein said fourth material includes the element Ti.

19. The memory element of claim 15, wherein said fourth material includes metallic titanium or a titanium alloy.

20. The memory element of claim 15, wherein said first and second layers have a thickness less than 300 Angstroms.

21. The memory element of claim 15, wherein said third material has a thickness less than 50 Angstroms.

22. The memory element of claim 15, wherein said programmable resistance materials consist essentially of a phase change material.

23. The memory element of claim 15, wherein said programmable resistance materials includes a chalcogen element.

24. The memory element of claim 15, wherein said first programmable resistance material is the same as said second programmable resistance material.

25. The memory element of claim 15, wherein said at least one electrode includes a first and a second electrode.

* * * * *